US012095223B1

(12) United States Patent
Sun

(10) Patent No.: US 12,095,223 B1
(45) Date of Patent: Sep. 17, 2024

(54) LASER DEVICE WITH AN EDGE EMITTING SOURCE SURFACE-MOUNTED FOR EMISSION AND ELECTRONIC DEVICE

(71) Applicant: Lijian Sun, Yiwu (CN)

(72) Inventor: Lijian Sun, Yiwu (CN)

( * ) Notice: Subject to any disclaimer, the term of this patent is extended or adjusted under 35 U.S.C. 154(b) by 0 days.

(21) Appl. No.: 18/605,578

(22) Filed: Mar. 14, 2024

(30) Foreign Application Priority Data

Jun. 27, 2023 (CN) .......................... 202321650681.7

(51) Int. Cl.
*H01S 5/023* (2021.01)
*H01S 5/02255* (2021.01)
*H01S 5/02315* (2021.01)
*H01S 5/02345* (2021.01)
*H01S 5/042* (2006.01)

(52) U.S. Cl.
CPC .......... *H01S 5/023* (2021.01); *H01S 5/02255* (2021.01); *H01S 5/02315* (2021.01); *H01S 5/02345* (2021.01); *H01S 5/042* (2013.01); *H01S 5/04254* (2019.08)

(58) Field of Classification Search
CPC .. H01S 5/023; H01S 5/02255; H01S 5/02315; H01S 5/02345; H01S 5/042; H01S 5/04254
See application file for complete search history.

(56) References Cited

U.S. PATENT DOCUMENTS

| 7,547,924 | B1 | 6/2009 | Lin | |
|---|---|---|---|---|
| 8,432,089 | B2 | 4/2013 | Yang | |
| 2007/0097678 | A1 | 5/2007 | Yang | |
| 2015/0008552 | A1* | 1/2015 | Matsusue | H01S 5/0427 257/431 |
| 2015/0318664 | A1* | 11/2015 | Eckert | H01S 5/0237 29/841 |
| 2017/0093123 | A1* | 3/2017 | Takizawa | H01S 5/0233 |
| 2019/0131767 | A1* | 5/2019 | Lee | H01S 5/02345 |
| 2019/0260179 | A1* | 8/2019 | Ueyama | H01S 5/02208 |

FOREIGN PATENT DOCUMENTS

CN 111029896 B 4/2020

* cited by examiner

*Primary Examiner* — Yuanda Zhang
(74) *Attorney, Agent, or Firm* — Jeenam Park

(57) ABSTRACT

This application provides a laser device with an edge emitting source surface-mounted for emission and an electronic device. The laser device includes parts involved in the following: A bottom plate of a housing covers a bottom end of a housing body, and the bottom plate includes a first conductive region and a second conductive region apart from each other. An inner cavity of the housing body and the bottom plate form a mounting cavity with a light outlet opposite the bottom plate, and the mounting cavity is provided in a light source assembly. A side surface of the light source chip facing the light outlet is a light-emitting surface, and light is projected from the front of the light outlet. The technical solution provided by this application is to attach an edge emitting source chip onto the mounting side surface of the support member, so as to achieve frontward projecting.

8 Claims, 7 Drawing Sheets

LASER DEVICE WITH AN EDGE EMITTING SOURCE SURFACE-MOUNTED FOR EMISSION AND ELECTRONIC DEVICE

CROSS-REFERENCE TO RELATED APPLICATIONS

This application claims priority to Chinese Patent Application No. 202321650681.7, filed on Jun. 27, 2023, which is hereby incorporated by reference in its entirety.

TECHNICAL FIELD

This application pertains to the technical field of laser devices, and in particular to, a laser device with an edge emitting source surface-mounted for emission and an electronic device.

BACKGROUND

One of the core components of a laser device is the laser chip, which serves as the light source. Currently, based on the manufacturing process of the resonant cavity, common laser chips on the market are divided into two types: edge-emitting laser (EEL: Edge Emitting Lasers) chips and vertical-cavity surface-emitting laser (VCSEL: Vertical Cavity Surface Emitting Laser) chips. Usually, the edge-emitting laser chip is disposed in a cavity of the laser device, the cavity having an outwardly open light outlet. The positive and negative electrodes of the chip are respectively electrically connected to corresponding conductive components to achieve circuit connection. Due to the substantial heat generated by the light source of the laser device during operation, the cavity is also equipped with a substrate that serves the functions of thermal conduction, heat dissipation, and support. The edge-emitting laser chip is disposed on the top surface of the substrate facing the light outlet, and emits light along the direction parallel to the top surface of the substrate. However, since the edge-emitting laser chip uses side-emission, in order to achieve frontward projecting from the light outlet, it is necessary to incorporate reflective components that can redirect edge-emitted light into frontward-directed light. Alternatively, a reflective surface with a specially designed optical path is placed on the inner cavity surface of the cavity. This results in complex design of the entire structure of the laser device and may cause large overall volume. Moreover, in this optical design of reflecting the edge-emitted light for forward emission, the minimum diameter of the laser spot is the distance from the laser chip to the outer edge of the reflective surface, which leads to a large laser spot and decrease in light after reflection, weakening the reflecting effect. For example, in a patent (No. CN111029896B): a packaging structure of a TOF module of an EEL device and a manufacturing method thereof, an EEL device (that is, an edge-emitting laser chip) is disposed on the top surface of an AlN transition heat sink (equivalent to a substrate serving the functions of thermal conduction, heat dissipation, and support), light is emitted from the side surface of the EEL device, reflected by a high-reflectivity planar mirror disposed on a side, and projected from the front of the light outlet. Therefore, how to design a simple-structure laser device using an edge-emitted laser chip to achieve frontward projecting with a better emitting effect is a problem to be resolved urgently in this sector.

SUMMARY

An objective of the embodiments of this application is to provide a laser device with an edge emitting source surface-mounted for emission, to resolve the foregoing technical problem in the prior art.

To achieve the foregoing objective, the technical solution used in this application is to provide a laser device with an edge emitting source surface-mounted for emission, including:

a housing including an insulated housing body and a conductive bottom plate, where the bottom plate covers a bottom end of the housing body, and an inner cavity of the housing body and the bottom plate form a mounting cavity; the mounting cavity has a light outlet opposite the bottom plate; and the bottom plate includes a first conductive region and a second conductive region apart from each other; and a light source assembly disposed in the mounting cavity and including a light source chip, a support member, a first conductive piece, and a second conductive piece, where the support member has a mounting side surface relatively perpendicular to the light outlet, and the first conductive piece and the second conductive piece are separately attached onto the mounting side surface; a bottom of the light source chip is a chip negative electrode, and the chip negative electrode conductively fits with the first conductive piece and is electrically connected to the first conductive region via the first conductive piece; a top of the light source chip is a chip positive electrode, and the chip positive electrode is electrically connected to the second conductive piece via a conductive wire and also to the second conductive region via the second conductive piece; and a side surface of the light source chip facing the light outlet is a light-emitting surface, and light emitted by the light source chip is projected from the front of the light outlet.

Optionally, the light source assembly further includes a voltage regulating diode chip, a bottom surface of the voltage regulating diode chip conductively fits with the first conductive piece, and a top surface of the voltage regulating diode chip is electrically connected to the chip positive electrode.

Optionally, the voltage regulating diode chip is disposed on a side of the light source chip away from the second conductive piece.

Optionally, the first conductive piece and the second conductive piece are both L-shaped, the first conductive piece includes a first body and a first pin, and the first pin is shaped by extending, from a bottom end of the first body facing the bottom plate, towards a direction back away from the second conductive piece; and the second conductive piece includes a second body and a second pin, and the second pin is shaped by extending, from a bottom end of the second body facing the bottom plate, towards a direction back away from the second conductive piece; and the voltage regulating diode chip and the light source chip are both attached onto the first body, and the bottom end of the first body and the first pin are conductively bonded with the first conductive region via a conductive adhesive; and the bottom end of the second body and the second pin are conductively bonded with the second conductive region via the conductive adhesive.

Optionally, the support member is disposed in a side region of the mounting cavity, and the light-emitting surface of the light source chip is adjacent to or located at a central axis of the mounting cavity.

Optionally, the support member is made of aluminum oxide or aluminum nitride with a surface coated with a gold-plated copper foil.

Optionally, a bottom surface of the support member is bonded on the bottom plate via the conductive adhesive.

Optionally, the laser device with an edge emitting source surface-mounted for emission further includes a resistor, where the resistor is mounted in the mounting cavity; and the bottom plate further includes a third conductive region apart from both the first conductive region and the second conductive region, one end of the resistor is electrically connected to the first conductive region, and the other end of the resistor is electrically connected to the third conductive region.

Optionally, the mounting cavity is sealed with a transparent sealing adhesive, and the sealing adhesive completely covers the light source assembly; or the laser device with an edge emitting source surface-mounted for emission further includes a transparent cover plate, and the transparent cover plate covers the light outlet.

This application further provides an electronic device, including an electronic control board and several laser devices with an edge emitting source surface-mounted for emission as described above, where the laser devices with an edge emitting source surface-mounted for emission are electrically connected to the electronic control board.

The laser device with an edge emitting source surface-mounted for emission provided by this application has the following beneficial effects: Because the side surface of the light source chip is the light-emitting surface, the light source chip is mounted on the mounting side surface of the support member perpendicular the light outlet, and the first conductive piece and the second conductive piece both mounted on the mounting side surface respectively achieve the circuit connection of the negative electrode and the positive electrode, thus allowing the light emitted by the light source chip to be projected from the front surface of the light outlet, that is, achieving frontward projecting. In addition, such design of combining side-surface light emitting and side-surface mounting of the light source chip can avoid the arrangement of a reflector or a particular reflective surface in the prior art, thus allowing for a simpler structure of the laser device and facilitating further decrease in volume and cost. Further, in the technical solution of this application, the light ray of the light source chip is directly projected instead of being reflected as required in the prior art, and therefore, light loss due to reflection does not occur and the light spots of the projected lasers are small. This is conducive to improving the light emitting effect of the laser device.

BRIEF DESCRIPTION OF DRAWINGS

To describe the technical solutions in the embodiments of this application more clearly, the following briefly describes the accompanying drawings required for describing the embodiments or the prior art. Apparently, the accompanying drawings in the following description show only some embodiments of this application, and persons of ordinary skill in the art may still derive other drawings from these accompanying drawings without creative efforts.

Figure 1:
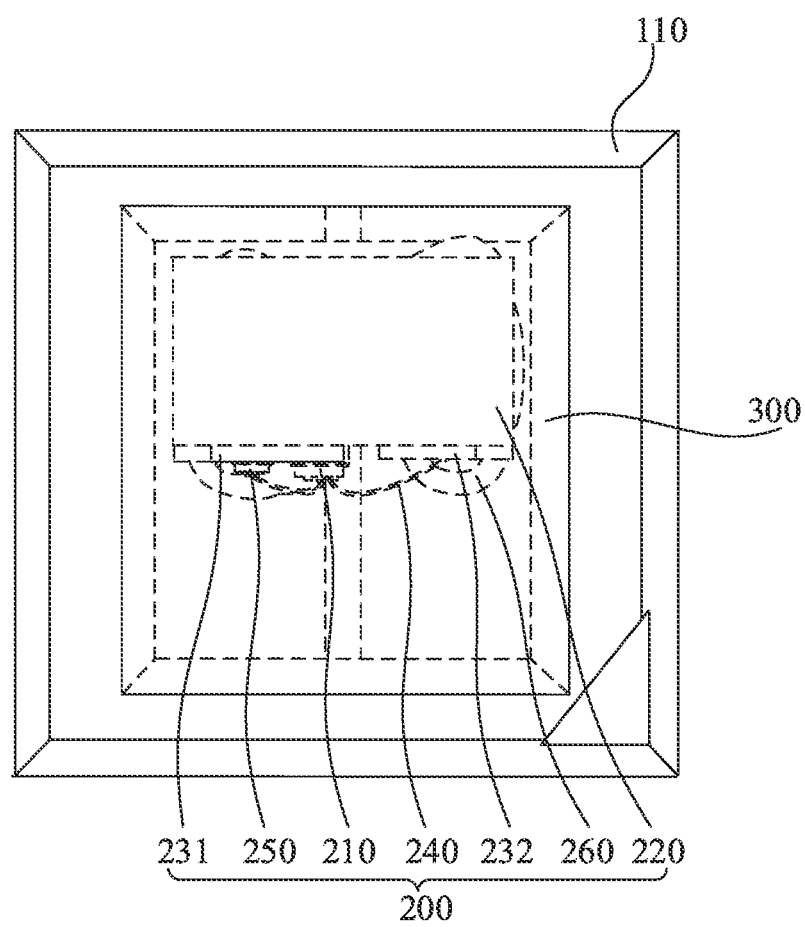
FIG. 1 is a front perspective view of a laser device with an edge emitting source surface-mounted for emission according to an embodiment of this application.
Figure 2:
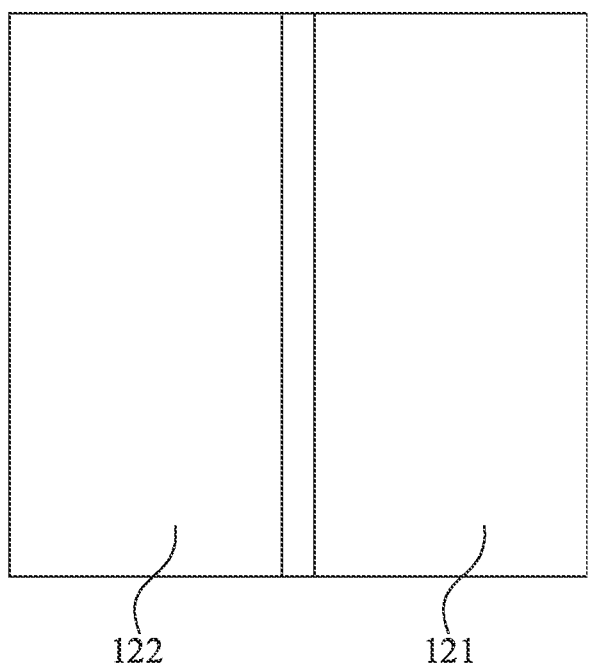
FIG. 2 is a rear perspective view of a laser device with an edge emitting source surface-mounted for emission according to an embodiment of this application.

Numeral references in the drawings are described below:

| Numeral reference | Term |
| --- | --- |
| 100 | Housing |
| 110 | Housing body |
| 120 | Bottom plate |
| 121 | First conductive region |
| 122 | Second conductive region |
| 123 | Third conductive region |
| 130 | Mounting cavity |
| 131 | Light outlet |
| 200 | Light source assembly |
| 210 | Light source chip |
| 211 | Light-emitting surface |
| 220 | Support member |
| 221 | Mounting side surface |
| 231 | First conductive piece |
| 231a | First body |
| 231b | First pin |
| 232 | Second conductive piece |
| 232a | Second body |
| 232b | Second pin |
| 240 | Conductive wire |
| 250 | Voltage regulating diode chip |
| 260 | Conductive adhesive |
| 270 | Resistor |
| 300 | Sealing adhesive |

DESCRIPTION OF EMBODIMENTS

To make the technical problems, technical solutions, and beneficial effects of this application more comprehensible, the following describes this application in detail with reference to accompanying drawings and embodiments. It should be understood that the specific embodiments described herein are merely used to explain this application but are not intended to limit this application.

It needs to be noted that when a component is referred to as being "fixed to" or "disposed on" another component, it may be directly or indirectly on the another component. When a component is referred to as being "connected to" another component, it may be directly or indirectly connected to the another component.

It needs to be also stated that the orientation terms such as left, right, up, and down used in the embodiments of this application are only relative concepts or are referenced to normal usage states of the product and should not be considered as being restrictive.

It should be understood that the orientations or positional relationships indicated by the terms "length", "width", "upper", "lower", "front", "rear", "left", "right", "perpendicular", "horizontal", "top", "bottom", "inside", "outside", and the like are based on the orientations or positional relationships shown in the accompanying drawings. These terms are merely for ease and brevity of description of this application rather than indicating or implying that the apparatuses or components mentioned must have specific orientations or must be constructed or manipulated according to specific orientations, and therefore shall not be construed as any limitations on this application.

In addition, the terms "first" and "second" are merely for the purpose of description, and shall not be understood as any indication or implication of relative importance or any implicit indication of the number of technical features indicated. Therefore, a feature limited by "first" or "second" may explicitly or implicitly include one or more features. In the description of this application, "a plurality of" means two or two more unless otherwise specifically stated.

In this application, unless otherwise specified and defined explicitly, the terms "mount", "connect", "join", and "fasten" should be understood in their general senses. For example, they may refer to a fixed connection, a detachable connection, or an integral connection, may refer to a mechanical connection or an electrical connection, and may refer to a direct connection, an indirect connection via an intermediate medium, an internal communication between two elements, or an interaction between two elements. Persons of ordinary skills in the art can understand specific meanings of these terms in this application as appropriate to specific situations.

The embodiments of this application are described in detail below. Examples of the embodiments are shown in the accompanying drawings, and the same or similar reference signs indicate the same or similar components or components with the same or similar functions. The embodiments described below with reference to the drawings are illustrative and merely for explaining this application. They should not be construed as limitations on this application.

An embodiment of this application provides a laser device with an edge emitting source surface-mounted for emission.

Referring to FIGS. 1 to 4, in an embodiment, the laser device with an edge emitting source surface-mounted for emission includes a housing 100 and a light source assembly 200. Specifically, the housing 100 includes an insulated housing body 110 and a conductive bottom plate 120. The bottom plate 120 covers a bottom end of the housing body 110, an inner cavity of the housing body 110 and the bottom plate 120 form a mounting cavity 130; the mounting cavity 130 has a light outlet 131 opposite the bottom plate 120; and the bottom plate 120 includes a first conductive region 121 and a second conductive region 122 apart from each other. A light source assembly 200 is disposed in the mounting cavity 130 and includes a light source chip 210, a support member 220, a first conductive piece 231, and a second conductive piece 232. The support member 220 has a mounting side surface 221 relatively perpendicular to the light outlet 131, and the first conductive piece 231 and the second conductive piece 232 are separately attached onto the mounting side surface 221; a bottom of the light source chip 210 is a chip negative electrode, and the chip negative electrode conductively fits with the first conductive piece 231 and is electrically connected to the first conductive region 121 via the first conductive piece 231; a top of the light source chip 210 is a chip positive electrode, and the chip positive electrode is electrically connected to the second conductive piece 232 via a conductive wire 240 and also to the second conductive region 122 via the second conductive piece 232; and a side surface of the light source chip 210 facing the light outlet 131 is a light-emitting surface 211, and light emitted by the light source chip 210 is projected from the front of the light outlet 131. Herein, the quantity of the light source chip 210 is unnecessarily limited to one, and the technical solution where one or more light source chips 210 are attached onto the mounting side surface 221 of the support member 220 also falls into the protection range of this application.

It should be noted herein that the laser device with an edge emitting source surface-mounted for emission, serving as a device emitting laser, is especially suitable for the electronic devices such as electric laser hair growth devices and health monitoring wristbands. For example, multiple such laser devices are mounted at intervals in the electric laser hair growth device, and these laser devices can emit medical lasers at around 650 nanometers onto the scalp, stimulating the hair follicles, thus assisting in hair growth and retention. For example, the health monitoring wristband can intelligently monitor blood pressure, blood sugar, blood lipid, and cardiovascular health, and these laser devices mounted in the wristband can also emit medical lasers at around 650 nanometers onto the radial artery, thus achieving laser therapy function to some extent. Certainly, in another embodiment, there are several types of electronic devices using the laser devices, which are not limited to the foregoing examples. In this embodiment, the dimension of the laser device is in millimeter, and its length, width, and height may be but are not limited to 3.5 mm*3.5 mm*1.3 mm, indicating a quite small volume, and therefore the laser device is more suitable for a small-sized electronic device. Certainly, in another embodiment, the dimension of the laser device may be designed based on actual requirements. Herein, the conductive wire 240 is preferably a conductive gold wire. To be specific, the chip positive electrode is electrically connected to the second conductive piece 232 via the gold wire. In this application, the light source chip 210 is specifically an edge-emitted laser chip, and the support member 220 is commonly called a substrate in this sector, supports the light source chip 210, and conducts and dissipates heat. In addition, the substrate of the conductive bottom plate 120 may be but is not limited to plastic or ceramic and then plated with a conductive material, which is, for example, but not limited to a silver-plated copper foil.

In this embodiment, because the side surface of the light source chip 210 is the light-emitting surface 211, the light source chip 210 is mounted on the mounting side surface 221 of the support member 220 perpendicular the light outlet 131, and the first conductive piece 231 and the second conductive piece 232 both mounted on the mounting side surface 221 respectively achieve the circuit connection of the negative electrode and the positive electrode, thus allowing the light emitted by the light source chip 210 to be projected from the front surface of the light outlet 131, that is, achieving frontward projecting. In addition, such design of combining side-surface light emitting and side-surface mounting of the light source chip 210 can avoid the arrangement of a reflector or a particular reflective surface in the prior art, thus allowing for a simpler structure of the laser device and facilitating further decrease in volume and cost.

Further, in the technical solution of this application, the light ray of the light source chip 210 is directly projected instead of being reflected as required in the prior art, and therefore, light loss due to reflection does not occur and the light spots of the projected lasers are small. This is conducive to improving the light emitting effect of the laser device.

Referring to FIG. 1, in this embodiment, the light source assembly 200 further includes a voltage regulating diode chip 250, a bottom surface of the voltage regulating diode chip 250 conductively fits with the first conductive piece 231, and a top surface of the voltage regulating diode chip 250 is electrically connected to the chip positive electrode. Herein, the voltage regulating diode chip 250 is also called a zener diode, which is a diode primarily used for voltage regulation. Its current can vary over a wide range and the voltage is basically kept constant. Specifically, the voltage regulating diode chip 250 is bonded on the first conductive piece 231 via a conductive adhesive, its negative electrode is electrically connected to the first conductive region 121 via the first conductive piece 231, and its positive electrode pin is electrically connected to the chip positive electrode via the gold wire and the light source chip 210.

Figure 3:
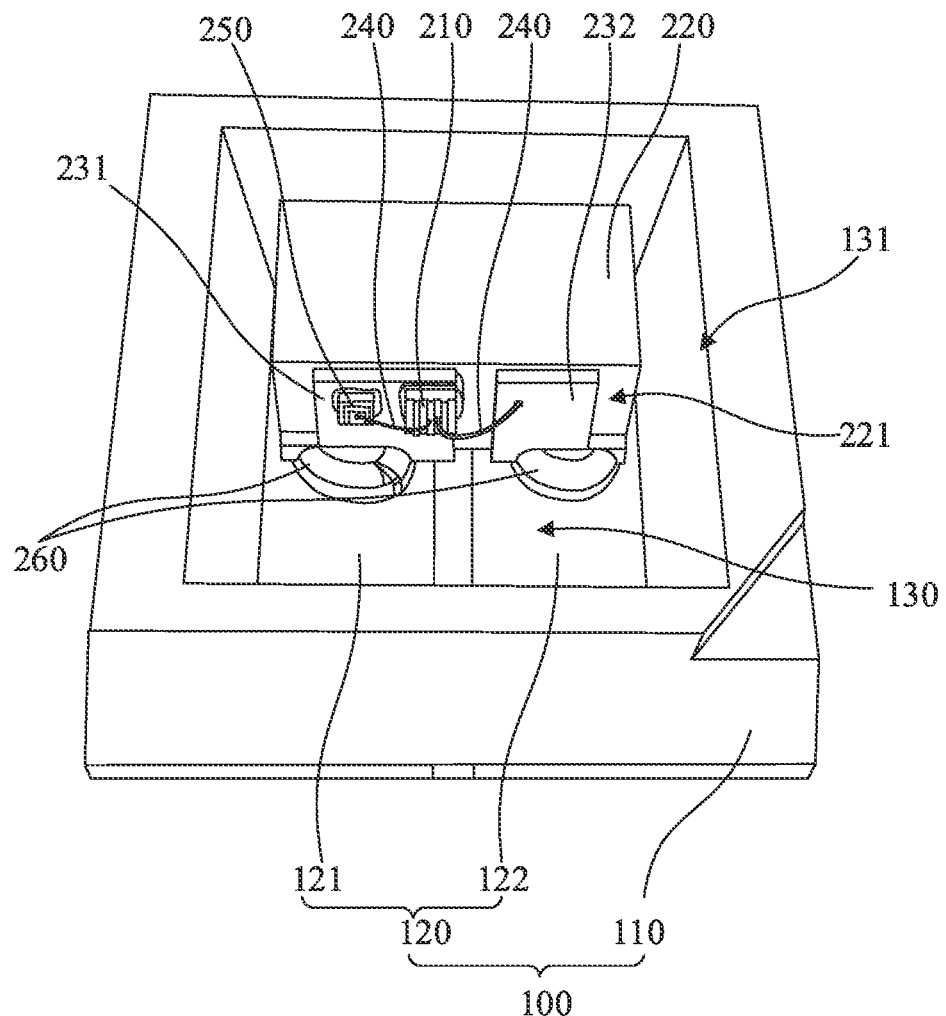
FIG. 3 is a schematic structural diagram of a laser device with an edge emitting source surface-mounted for emission being unsealed according to an embodiment of this application.
Figure 4:
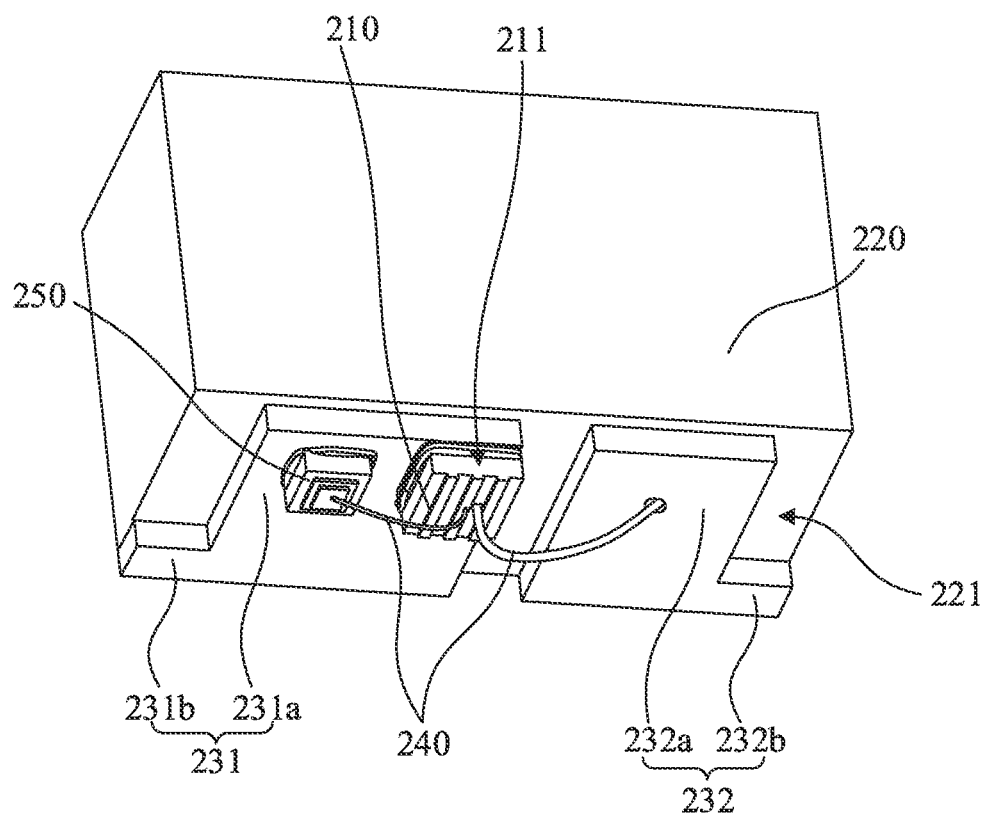
FIG. 4 is a schematic structural diagram of a light source assembly of a laser device with an edge emitting source surface-mounted for emission being unsealed according to an embodiment of this application.

Further, as shown in FIGS. 1, 3, and 4, the voltage regulating diode chip 250 is disposed on a side of the light source chip 210 away from the second conductive piece 232. Specifically, the length direction of the support member 220 in the shape of the rectangular block shown in the figure is the left-right direction. The first conductive piece 231 and the second conductive piece 232 are distributed left and right, and the voltage regulating diode chip 250 is located on the left side of the light source chip 210. In other words, the light source chip 210 is located between the voltage regulating diode chip 250 and the second conductive piece 232. Certainly, in another embodiment, components such as the voltage regulating diode chip 250, the light source chip 210, and the second conductive piece 232 may be in other positions, but in this embodiment, the position arrangement shown in the figure facilitates the connection of the conductive wire 240 and circuit layout.

Further, in this embodiment, the support member 220 is disposed in a side region of the mounting cavity 130, and the light-emitting surface 211 of the light source chip 210 is adjacent to or located at a central axis of the mounting cavity 130. This enables the light emitted by the light source chip 210 to be projected from the central region of the light outlet 131 as much as possible, thus reducing the light loss and improving the light emitting effect.

Referring to FIGS. 1 to 4, in this embodiment, the first conductive piece 231 and the second conductive piece 232 are both L-shaped, the first conductive piece 231 includes a first body 231a and a first pin 231b, and the first pin 231b is shaped by extending, from a bottom end of the first body 231a facing the bottom plate 120, towards a direction back away from the second conductive piece 232; and the second conductive piece 232 includes a second body 232a and a second pin 232b, and the second pin 232b is shaped by extending, from a bottom end of the second body 232a facing the bottom plate 120, towards a direction back away from the second conductive piece 232. The voltage regulating diode chip 250 and the light source chip 210 are both attached onto the first body 231a, and the bottom end of the first body 231a and the first pin 231b are conductively bonded with the first conductive region 121 via a conductive adhesive 260; and the bottom end of the second body 232a and the second pin 232b are conductively bonded with the second conductive region 122 via the conductive adhesive 260. Herein, the conductive adhesive 260 is preferably but not limited to an adhesive that conducts electricity and heat. In addition, the extended pin can increase the bonding area between the adhesive and the L-shaped first conductive piece 231 and second conductive piece 232, ensuring firmer bonding between the two conductive pieces and the adhesive, thus ensuring smooth circuit.

Referring to FIGS. 1, 3, and 4, in this embodiment, the support member 220 is made of aluminum oxide or aluminum nitride with a surface coated with a gold-plated copper foil. Due to the significant heat generated by the light source of the laser device during operation, to ensure the normal operation of the light source chip 210, a proper heat dissipation solution needs to be proposed. Herein, aluminum oxide or aluminum nitride, as a ceramic material, possesses a good heat dissipation ability and a suitable heat dissipation coefficient, and therefore can be used to well address the heat dissipation issues of the light source chip 210. Further, the arrangement of the aluminum oxide or aluminum nitride with a surface coated with a gold-plated copper foil can further enhance its heat conducting performance.

Referring to FIGS. 1 and 3, in this embodiment, a bottom surface of the support member 220 is bonded on the bottom plate 120 via the conductive adhesive 260. Specifically, the length direction of the support member 220 in the shape of a rectangular block shown in the figure is the left-right direction. The conductive adhesive 260 is preferably but not limited to an adhesive that conducts electricity and heat. A side region of the bottom surface of the support member 220 is bonded with the first conductive region 121 via the adhesive, and the first conductive piece 231 is also bonded with the first conductive region 121 via the adhesive. The adhesive also conducts electricity and heat for the first conductive piece 231. Similarly, another side region of the bottom surface of the support member 220 is bonded with the second conductive region 122 via the adhesive, and the second conductive piece 232 is also bonded with the second conductive region 122 via the adhesive. The adhesive also conducts electricity and heat for the second conductive piece 232.

Figure 5:
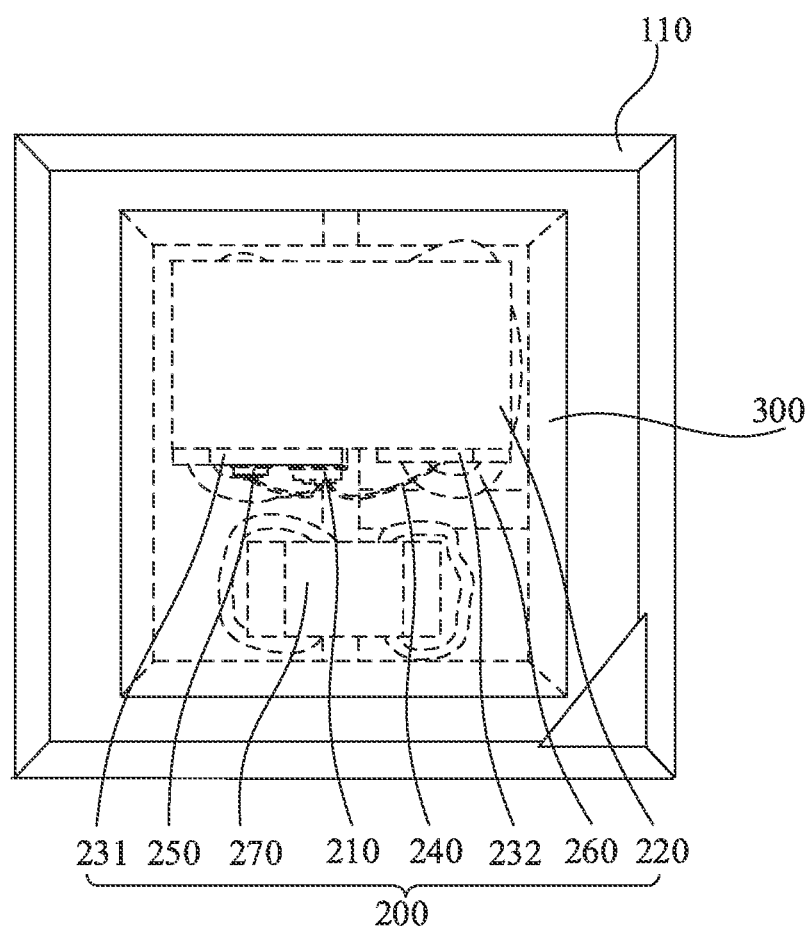
FIG. 5 is a front perspective view of a laser device with an edge emitting source surface-mounted for emission according to another embodiment of this application.
Figure 6:
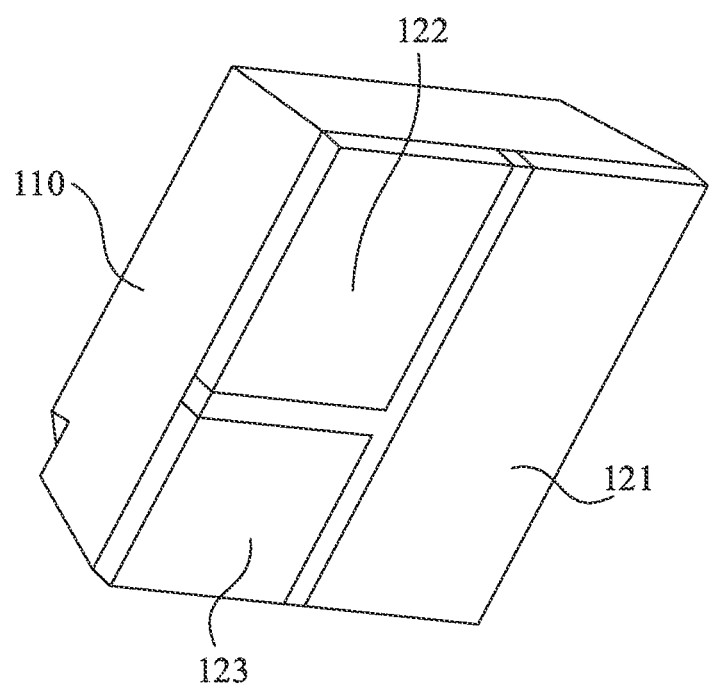
FIG. 6 is a schematic structural diagram of a laser device with an edge emitting source surface-mounted for emission according to another embodiment of this application.
Figure 7:
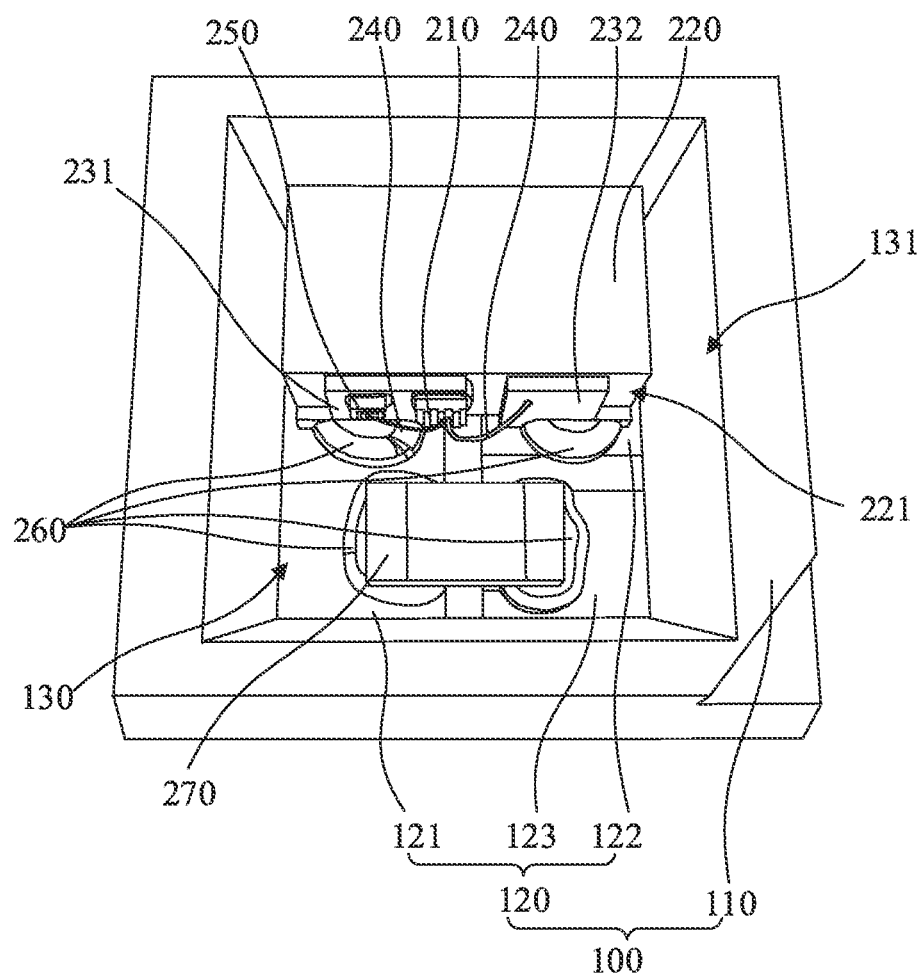
FIG. 7 is a schematic structural diagram of a laser device with an edge emitting source surface-mounted for emission being unsealed according to another embodiment of this application.

Referring to FIGS. 5 to 7, in another embodiment, the laser device with an edge emitting source surface-mounted for emission further includes a resistor 270, and the resistor 270 is disposed in the mounting cavity 130. The bottom plate 120 further includes a third conductive region 123 apart from both the first conductive region 121 and the second conductive region 122, one end of the resistor 270 is electrically connected to the first conductive region 121, and the other end of the resistor 270 is electrically connected to the third conductive region 123. Specifically, the width direction of the support member 220 in the shape of a rectangular block shown in the figure is the front-back direction. The support member 220 and the light source assembly 200 are located in a rear space of the mounting cavity 130, the resistor 270 is located in the front space of the mounting cavity 130, and the third conductive region 123 is located in front of the second conductive region 122. One end of the bottom surface of the resistor 270 is bonded with the first conductive region 121 via the adhesive, and the other end of the bottom surface of the resistor 270 is bonded with the third conductive region 123 via the adhesive. Herein, the resistor 270 mainly limits current and prevents the impact of the pulse voltage, thus helping to increase the service life of the light source chip 210.

Referring to FIGS. 1 and 5, in two embodiments, to protect each electronic element in the mounting cavity 130, the mounting cavity 130 is sealed with a transparent sealing adhesive 300. In an embodiment shown in FIG. 1, the sealing adhesive 300 completely covers the light source assembly 200. In another embodiment shown in FIG. 5, the sealing adhesive 300 also fills the mounting cavity 130 while completely covering the resistor 270. The light emitted by the light source chip 210 passes through the sealing adhesive 300 to be projected from the light outlet 131. However, this design is not limited thereto. In another embodiment, the laser device with an edge emitting source surface-mounted for emission further includes a transparent cover plate, and the transparent cover plate covers the light outlet 131. Herein, the transparent cover plate mainly protects the internal devices and allows the light to pass through. That is, the light emitted from the side surface of the light source chip 210 passes through the transparent cover plate to be projected outward.

This application further provides an electronic device, including an electronic control board and several laser devices with an edge emitting source surface-mounted for emission as described above, where the laser devices with an edge emitting source surface-mounted for emission are electrically connected to the electronic control board. The electrical connection may be but is not limited to being surface-mounted on the electronic control board or being connected via a conductive connection wire. For the specific structure of the laser device with an edge emitting source surface-mounted for emission, refer to the foregoing embodiments. The electronic device uses the technical solutions in all the foregoing embodiments, with the same beneficial effects as achieved in the technical solutions of the foregoing embodiments, which is not elaborated again herein.

The foregoing descriptions are merely preferable embodiments of this application, but are not intended to limit this application. Any modification, equivalent replacement, or improvement made without departing from the spirit and principle of this application shall fall within the protection scope of this application.

What is claimed is:

1. A laser device with an edge emitting source surface-mounted for emission, comprising:
    a housing comprising an insulated housing body and a conductive bottom plate, wherein the bottom plate covers a bottom end of the housing body, and an inner cavity of the housing body and the bottom plate form a mounting cavity; the mounting cavity has a light outlet opposite the bottom plate; and the bottom plate comprises a first conductive region and a second conductive region apart from each other;
    a light source assembly disposed in the mounting cavity and comprising a light source chip, a support member, a first conductive piece, and a second conductive piece, wherein the support member has a mounting side surface relatively perpendicular to the light outlet, and the first conductive piece and the second conductive piece are separately attached onto the mounting side surface; a bottom of the light source chip is a chip negative electrode, and the chip negative electrode conductively fits with the first conductive piece and is electrically connected to the first conductive region via the first conductive piece; a top of the light source chip is a chip positive electrode, and the chip positive electrode is electrically connected to the second conductive piece via a conductive wire and also to the second conductive region via the second conductive piece; and a side surface of the light source chip facing the light outlet is a light-emitting surface, and light emitted by the light source chip is projected from the front of the light outlet;
    the light source assembly further comprises a voltage regulating diode chip, a bottom surface of the voltage regulating diode chip conductively fits with the first conductive piece, and a top surface of the voltage regulating diode chip is electrically connected to the chip positive electrode;
    the first conductive piece and the second conductive piece are both L-shaped, the first conductive piece comprises a first body and a first pin, and the first pin is shaped by extending, from a bottom end of the first body facing the bottom plate, towards a direction back away from the second conductive piece; and the second conductive piece comprises a second body and a second pin, and the second pin is shaped by extending, from a bottom end of the second body facing the bottom plate, towards the direction back away from the second conductive piece; and
    the voltage regulating diode chip and the light source chip are both attached onto the first body, and the bottom end of the first body and the first pin are conductively bonded with the first conductive region via a conductive adhesive; and the bottom end of the second body and the second pin are conductively bonded with the second conductive region via the conductive adhesive.

2. The laser device with an edge emitting source surface-mounted for emission according to claim 1, wherein the voltage regulating diode chip is disposed on a side of the light source chip away from the second conductive piece.

3. The laser device with an edge emitting source surface-mounted for emission according to claim 1, wherein the support member is disposed in a side region of the mounting cavity, and the light-emitting surface of the light source chip is adjacent to or located at a central axis of the mounting cavity.

4. The laser device with an edge emitting source surface-mounted for emission according to claim 1, wherein the support member is made of aluminum oxide or aluminum nitride with a surface coated with a gold-plated copper foil.

5. The laser device with an edge emitting source surface-mounted for emission according to claim 1, wherein a bottom surface of the support member is bonded on the bottom plate via the conductive adhesive.

6. The laser device with an edge emitting source surface-mounted for emission according to claim 1, further comprising a resistor, wherein the resistor is mounted in the mounting cavity; and
    the bottom plate further comprises a third conductive region apart from both the first conductive region and the second conductive region, one end of the resistor is electrically connected to the first conductive region, and the other end of the resistor is electrically connected to the third conductive region.

7. The laser device with an edge emitting source surface-mounted for emission according to claim 1, wherein the mounting cavity is sealed with a transparent sealing adhesive, and the sealing adhesive completely covers the light source assembly; or
    the laser device with an edge emitting source surface-mounted for emission further comprises a transparent cover plate, and the transparent cover plate covers the light outlet.

8. An electronic device, comprising an electronic control board and several laser devices with an edge emitting source surface-mounted for emission according to claim 1, wherein the laser devices with an edge emitting source surface-mounted for emission are electrically connected to the electronic control board.

\* \* \* \* \*